United States Patent
Ballantine et al.

(10) Patent No.: US 6,489,663 B2
(45) Date of Patent: Dec. 3, 2002

(54) SPIRAL INDUCTOR SEMICONDUCTING DEVICE WITH GROUNDING STRIPS AND CONDUCTING VIAS

(75) Inventors: Arne W. Ballantine, Round Lake, NY (US); Robert A. Groves, Highland, NY (US); Michael B. Rice, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 09/753,284

(22) Filed: Jan. 2, 2001

(65) Prior Publication Data

US 2002/0084509 A1 Jul. 4, 2002

(51) Int. Cl.[7] .............................................. H01L 29/00
(52) U.S. Cl. ..................... 257/531; 257/528; 336/68; 336/84 R; 336/200
(58) Field of Search .................... 257/528, 531; 336/65, 68, 84 C, 84 R, 195, 196, 200, 208

(56) References Cited

U.S. PATENT DOCUMENTS

| | | | |
|---|---|---|---|
| 4,073,990 A | 2/1978 | Friedrich | 428/138 |
| 4,534,825 A | 8/1985 | Koning et al. | 438/49 |
| 4,551,746 A | 11/1985 | Gilbert et al. | 257/691 |
| 5,270,251 A | 12/1993 | Cohen | 438/467 |
| 5,355,013 A | 10/1994 | Parker | 257/458 |
| 5,386,115 A | 1/1995 | Freidhoff et al. | 250/281 |
| 5,592,391 A | 1/1997 | Muyshondt et al. | 716/15 |
| 5,742,091 A * | 4/1998 | Hebert | 257/531 |
| 5,796,170 A | 8/1998 | Marcantonio | 257/786 |
| 5,856,907 A | 1/1999 | Gabbai | 361/321.5 |
| 5,952,704 A * | 9/1999 | Yu et al. | 257/531 |
| 5,986,340 A | 11/1999 | Mostafazadeh et al. | 257/713 |
| 6,011,299 A | 1/2000 | Brench | 257/660 |
| 6,211,056 B1 * | 4/2001 | Begley et al. | 438/619 |
| 6,221,727 B1 * | 4/2001 | Chan et al. | 438/381 |
| 6,225,677 B1 * | 5/2001 | Kobayashi | 257/531 |
| 6,274,920 B1 * | 8/2001 | Park et al. | 257/531 |
| 6,310,387 B1 * | 10/2001 | Seefeldt et al. | 257/531 |

OTHER PUBLICATIONS

Murata et al., Effect of a Ground Shield of a Silicon On–Chip Spiral Inductor, 2000, IEEE, Microwave Conference, 2000 Asia–Pacific, pp. 177–180.*
Jiang et al., On–Chip Spiral Inductors Suspended over Deep Copper–Lined Cavities, Dec. 2000, IEEE Transactions on Microwave Theory and Techniques, vol. 48, No. 12, pp. 2415–2423.*
Yim et al., The Effects of a Ground Shield on Spiral Inductors Fabricated in a Silicon Bipolar Technology, 2000, IEEE BCTM 9.1, pp. 157–160.*
M. Dahmen, "Measuring the Contact Resistance of Metallization on Silicon", IBM Technical Disclosure Bulletin, vol. 15, No. 5, Oct. 1972, p. 1492.
C. Patrick Yue and Simon Wong, "On–Chip Sprial Inductors with Patterned Ground Shields for Si–Based RF IC's", Journal of Solid–State Circuits, vol. 33, No. 5., May 1998, pp. 743–752.
J.E. Rohen, "Ellectrostatic shielding for Magnetoresistive Read Heads, IBM Technical Disclosure Bulletin, vol. 21, No. 11, Apr. 1979, pp. 4459–4460."

* cited by examiner

Primary Examiner—George C. Eckert, II
(74) Attorney, Agent, or Firm—Schmeiser, Olsen & Watts

(57) ABSTRACT

An integrated semiconducting device comprises a semiconducting substrate, a plurality of grounding strips disposed above the substrate in a lower metal level of the semiconducting device, an inductor positioned in an upper metal level of the semiconducting device, and a plurality of conducting vias connected to and extending away from the grounding strips towards the inductor. The inductor, conducting via, ground strips structure forms a Faraday cage that acts as a shield against electromagnetic radiation. The number and placement of the conductive vias are adjustable and can be optimized based on the relative importance of maximizing the quality factor Q of the inductor or minimizing the capacitance between the inductor and ground.

28 Claims, 4 Drawing Sheets

SPIRAL INDUCTOR SEMICONDUCTING DEVICE WITH GROUNDING STRIPS AND CONDUCTING VIAS

BACKGROUND OF THE INVENTION

1. Technical Field

This invention generally relates to semiconductor devices and more specifically relates to an inductor on a conductive substrate.

2. Background Art

Since its development some decades ago, the integrated circuit (IC) has been improved and enhanced numerous times. Radio frequency integrated circuits (RF ICs) represent a single manifestation of the impressive array of IC embodiments that have arisen as a result of the considerable research and development in the field. Spiral inductors are used extensively to integrate RF functions onto ICs. The typical inductor consists of a spiral arranged in a layer of metal near the top of the wafer, a drop-down via connecting the spiral to the next metal level, and an underpass providing a connecting point exterior to the spiral structure.

Although the spiral inductor arrangement works well on chips with semi-insulating substrates like gallium arsenide (GaAs), it becomes problematic when it is used with semi-conducting substrates like silicon (Si). The reason for this arises from the fact that electric fields cause current to flow in nearby conductive media. This induced current in turn causes a power loss characterized by the relationship $P=I^2R$ where I is the current and R is the resistivity of the substance in which the current is flowing. Power losses are undesirable for several reasons. Excessive power loss decreases selectivity in resonant circuits and increases noise. The relationship between power loss and energy storage in an inductor is measured by a quantity called the quality factor Q. The goal is to maximize Q, which can be done by minimizing power losses; i.e., Q is inversely proportional to the power loss.

Referring now to FIG. 3, which will help illustrate this point, a typical integrated circuit 100 comprises a semiconducting substrate 12, a dielectric 14, and a spiral inductor 16. Spiral inductor 16 lies in an upper layer of dielectric 14. Semiconducting substrate 12 is disposed below dielectric 14 and spiral inductor 16. Substrate electric field lines 18 and inductor electric field lines 20, named for the location at which they terminate, are emitted from spiral inductor 16, pass through dielectric 14 and penetrate substrate 12, causing an electric current to flow therein. Substrate electric field lines 18 represent a parasitic electric field from spiral inductor 16 which terminates in substrate 12, while inductor electric field lines 20 represent a parasitic electric field from one side of spiral inductor 16 which passes through substrate 12 and terminates on the opposite side of spiral inductor 16. Both forms of parasitic electric field (those represented by reference numerals 18 and 20) cause displacement current to flow in substrate 12. This displacement current causes a power loss in spiral inductor 16. This power loss is equal to $I^2R$, where I represents the current flow and R represents the resistance. Semiconducting substrate 12 has an R value that is lower than an insulator would have, but R for a semiconductor is by no means zero. Spiral inductor 16 thus experiences a non-negligible, even significant, power loss.

Spiral inductor 16 is characterized by quality factor Q, which is the ratio of energy stored to power lost in the inductor. Higher Q values mean better inductor performance. In order to maximize Q, power loss must be minimized.

To minimize power loss one must prevent the electric field generated by the inductor from penetrating into the substrate. This can be accomplished by inserting a ground plane into the chip between the inductor and the substrate. Because it is grounded this plane has a much lower resistivity than does the substrate, leading to a power loss that is lower than that experienced with the substrate alone. This approach works well in applications where the ground plane can be well-separated from the substrate, as in GaAs chips where a typical separation can be around 300 microns. However, when a Si substrate is used, that relatively large separation isn't possible and the electric field enters the substrate before the ground plane can affect it. Therefore, in order to produce the desired shielding effect in a Si chip, a ground plane must be placed very close to the inductor, perhaps 10 or 12 microns away at most.

The problem that then arises is that with the ground plane occupying a space so close to the inductor, the inductor's magnetic field causes a current known as image current or loop current to flow in the ground plane. This image current flows in such a way as to oppose the magnetic field that is inducing it, as required by Lenz's law. The result of this induced current flow is a drop in inductance which leads to a dramatic drop in Q. This result is just the opposite of what was intended.

A solution to the image current problem is suggested in a paper authored by C. Patrick Yue and S. Simon Wong appearing in the IEEE Journal of Solid-State Circuits, Vol. 33, No. 5, May 1998 entitled "On-Chip Spiral Inductors with Patterned Ground Shields for Si-Based RF IC's." The paper proposes the use of a ground plane in which radial cuts have been made. These cuts interrupt and prevent the flow of the image current but do not cause the ground plane to lose its shielding effect with respect to the electric field. In other words, the electric field emanating from the inductor still preferentially penetrates the ground plane, where it is terminated. The result is an arrangement where the electric field is kept from penetrating the substrate, eliminating the power loss discussed above, while the induced image current in the ground plane, with its attendant problems, is simultaneously prevented. This solution is not without its drawbacks, however, and in spite of its popularity, some problems remain, as discussed below.

FIG. 4 shows a chip that uses the patterned ground plane approach. Typical integrated circuit 100 is now shown with patterned ground plane 22 inserted in a lower layer of dielectric 14 below spiral inductor 16. Patterned ground plane 22 is provided for the purpose of terminating the electric field emanating from spiral inductor 16. When substrate electric field lines 18 and inductor electric field lines 20 encounter a ground plane, the current they generate has a path of very low resistance to follow. This path leads away from semiconducting substrate 12 and since current preferentially follows a lower-resistivity path, the current flows to ground without penetrating semiconducting substrate 12. Thus, substrate electric field lines 18 are shown in this FIG. 4 as being terminated on patterned ground plane 22.

Cuts 24 in patterned ground plane 22 prevent the induction of image current by creating breaks and disruptions in the pathways where the image current would otherwise flow. Having no place to go the image current simply never is allowed to become a problem. In this way patterned ground plane 22 prevents the formation of image current at the same time that it terminates the parasitic electric field from spiral inductor 16, thus solving some, though not all, of the problems surrounding on-chip spiral inductor IC design. For an example of a problem that remains, consider that a patterned ground plane causes increased capacitance between itself and an inductor. This decreases the inductor's self-resonant frequency, discussed below, and limits the attainable Q value for the inductor. Because maximizing Q is one of the prevailing goals in inductor-included IC design, such spiral to ground capacitance can be a real problem.

There is a particular frequency for a given inductor at which the inductor becomes self-resonant. At and above that frequency the inductor and the ground plane undergo a capacitive coupling which sets up a parallel resonance circuit and suppresses the inductor's qualities. The system then acts just like a capacitor, i.e., as a storage device for electric, but not magnetic, energy. This self-resonant frequency is lowered with the introduction into an inductor-type IC of a ground plane, whether the ground plane be patterned or solid. What this means for an inductor in the presence of a ground plane is that its useful range is reduced. Beyond that shortcoming, the Yue-Wong approach limits the freedom with which the structure of a chip may be optimized for a particular application. Therefore, there existed a need to provide an inductor-included semiconductor device designed to reduce or substantially eliminate unwanted capacitive coupling between the inductor and ground while retaining its field-terminating effect and allowing for design optimization.

DISCLOSURE OF INVENTION

The present invention provides a way to avoid lowering an inductor's self-resonant frequency, thus preserving the inductor's useful operation over a wider range, while retaining the beneficial field-terminating effects of the patterned ground plane approach. The invention also allows the semiconductor to be optimized for a particular application.

According to the present invention, a semiconducting device is provided comprising a ground plane disposed between a spiral inductor and a conductive substrate. The ground plane is cut into a plurality of ground strips in order to prevent the flow of image current that would be induced in a solid ground plane by the magnetic field of the inductor. The ground strips are capacitively linked to the inductor by multiple connecting posts called conducting vias. These conducting vias are preferably formed out of a low-resistivity metal like copper or aluminum and act to terminate the parasitic electric field without excessively increasing the capacitance to ground. In the most preferred embodiment, fabrication of the conducting vias into the back-end-of-line (BEOL) metallurgy is accomplished by simply adding the via patterns to existing mask level designs and performing standard damascene fill processes as is currently practiced to form test via chains. The invention can thus be manufactured relatively inexpensively because no additional steps are necessary in the fabrication process. A further advantage of the invention is that it acts like a Faraday cage to eliminate unwanted electromagnetic radiation in the space inside the box formed by the inductor, the ground strips, and the vertical conducting vias.

Because the integrated circuit of this invention is simple to manufacture, it is easy to optimize the number and placement of the conducting vias to serve the integrated circuit's intended purpose. The placement and density of the conducting vias would be optimized for a particular geometry of inductor for operation at a specific frequency. This optimization process would weigh the competing priorities of terminating the electric field (increasing Q by decreasing power loss in the substrate) and decreasing the parasitic capacitance present between the spiral inductor and the ground strips (increasing the self resonant frequency and thus increasing Q). A high density of conducting vias underneath the spiral inductor would provide the most effective termination of the parasitic electric field of the spiral inductor, decreasing the power loss in the substrate. This high density configuration would also have a high spiral to ground parasitic capacitance which would tend to decrease the self resonant frequency of the structure. The density of the conducting vias would then be chosen based on two possible scenarios: maximizing Q at a particular frequency, or maximizing isolation between the spiral inductor and the substrate.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements.

MODES FOR CARRYING OUT THE INVENTION

According to the present invention, a semiconducting device is provided comprising a ground plane disposed between a spiral inductor and a conductive substrate. The ground plane is cut into a plurality of ground strips in order to prevent the flow of image current that would be induced in a solid ground plane by the magnetic field of the inductor. The ground strips are capacitively linked to the inductor by multiple conducting vias. These conducting vias are preferably formed out of a low-resistivity metal like copper or aluminum and act to terminate the parasitic electric field without excessively increasing the capacitance to ground. In a preferred embodiment, fabrication of the conducting vias into the back-end-of-line (BEOL) metallurgy is accomplished by simply adding the chain via patterns to existing mask level designs and performing standard damascene fill processes as is currently practiced to form test via chains.

Figure 1:
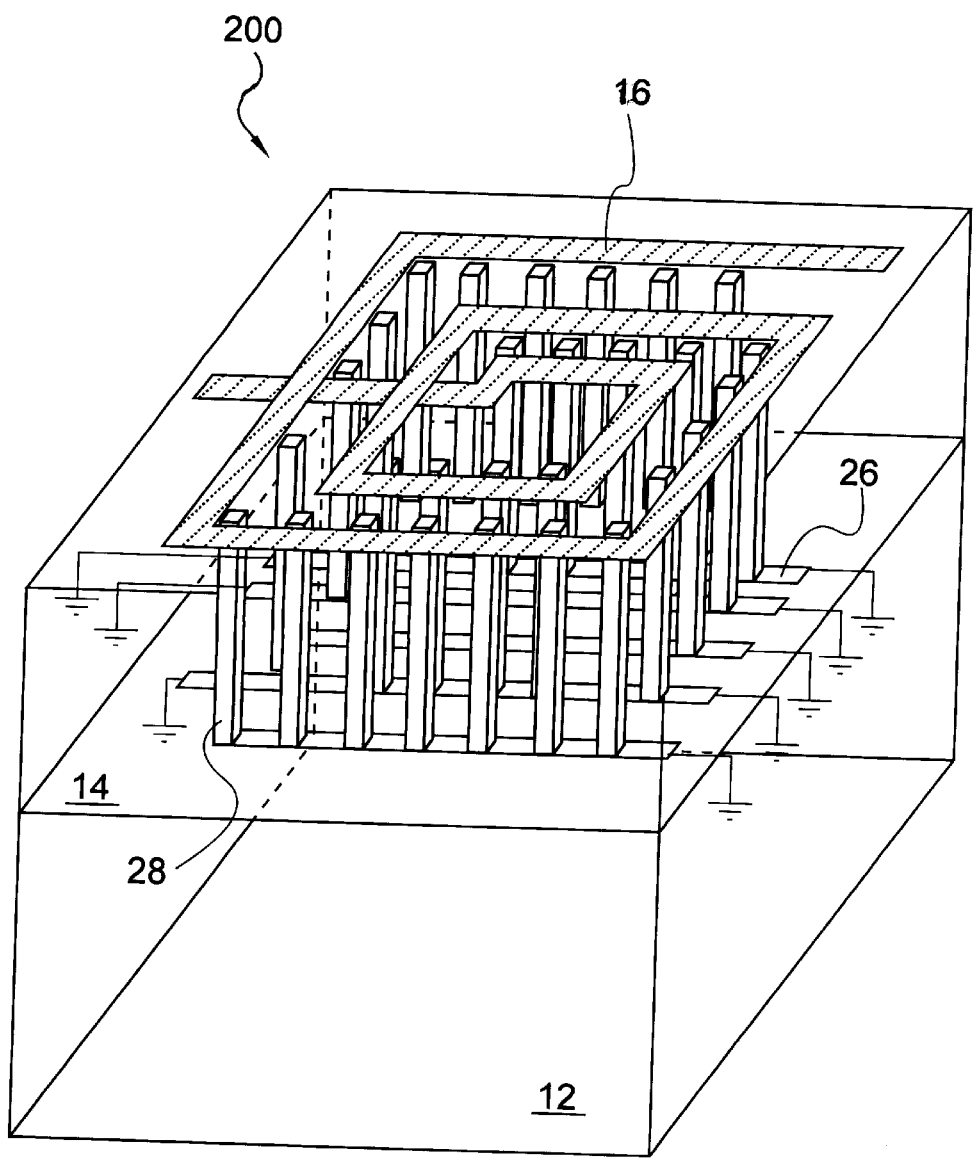
FIG. 1 is a three-dimensional view of the present invention.

Referring now to FIG. 1, which shows the present invention, integrated circuit 200 has semiconducting substrate 12 on which rests dielectric 14 containing spiral inductor 16 in an upper layer, ground strips 26 in a lower layer, and conducting vias 28 disposed between spiral inductor 16 and ground strips 26. Conducting vias 28 are connected to ground strips 26 at various locations as will be further explained in a subsequent paragraph. Integrated circuit 200 is shown in a preferred embodiment in which the inductor used is a spiral inductor, as shown at 16. It should be understood, however, that other inductor types are also possible.

In the preferred embodiment shown, the conducting vias are shown terminating between and slightly below the wires of the inductor because that is the configuration that most effectively keeps the capacitance down. However, it should be understood that the conducting vias could be arranged in a variety of ways, including an arrangement where they terminate underneath the inductor wires. Indeed, minimizing capacitance may not always be the primary goal. Therefore the present invention allows for different configurations of conducting vias 28 depending on the application for which integrated circuit 200 is intended.

Semiconducting substrate 12 is typically formed from silicon, although any typical semiconducting substance would serve just as well for purposes of this invention. The preferred orientation of conducting vias 28 with respect to ground strips 26 is substantially perpendicular. This orientation efficiently places conducting vias 28 in a position to intercept and terminate the electric field emanating from spiral inductor 16.

Ground strips 26 preferentially lie in a common plane consisting of the lowest metal layer of the IC. They are typically formed out of aluminum, copper, or polysilicon, with aluminum or copper being the preferred materials because their lower resistance provides a low loss path for the parasitic return current. The gaps between ground strips 26 are filled with dielectric 14, the same material that surrounds and separates other components of the IC and within which the IC components are formed. The presence of dielectric 14 isolates and insulates each one of ground strips 26, requiring that each one of ground strips 26 be individually connected to ground. Their location in the lowest metal layer of integrated circuit 200 makes this convenient.

An important feature of the present invention, more fully explained in connection with FIG. 2, below, is the fact that fabrication of conducting vias 28 requires no extra steps in the manufacturing process, but fits smoothly into processes already in place and in wide use. This simplicity allows easy optimization of the number and placement of conducting vias 28 to serve integrated circuit 200's intended purpose. The placement and density of conducting vias 28 would be optimized for a particular geometry of inductor for operation at a specific frequency. This optimization process would weigh the competing priorities of terminating the electric field (increasing Q by decreasing power loss in substrate 12) and decreasing the parasitic capacitance present between spiral inductor 16 and ground strips 26 (increasing the self resonant frequency and thus increasing Q). A high density of conducting vias 28 underneath spiral inductor 16 would provide the most effective termination of the parasitic electric field of spiral inductor 16, decreasing the power loss in substrate 12. This high density configuration would also have a high spiral to ground parasitic capacitance which would tend to decrease the self resonant frequency of the structure. The density of conducting vias 28 would then be chosen based on two possible scenarios: maximizing Q at a particular frequency, or maximizing isolation between spiral inductor 16 and substrate 12. In order to maximize Q, the density would be reduced from the maximum achievable, to that which would provide the highest Q. In order to achieve maximum isolation, the number of conducting vias 28 would be increased from the configuration required for maximum Q until the required level of shielding was present between spiral inductor 16 and substrate 12. The optimal density would then be different for each spiral geometric configuration, frequency, and design goal (isolation or high Q).

Figure 2:
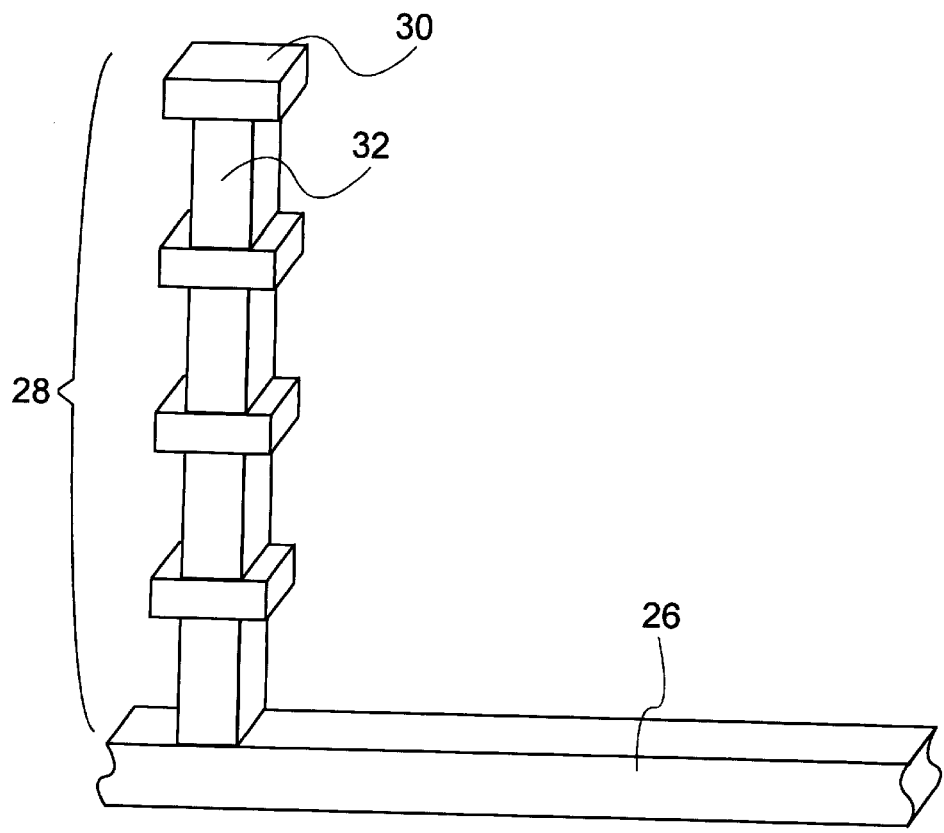
FIG. 2 is a perspective view of a conducting via attached to a grounding strip showing the via structure.
Figure 3:
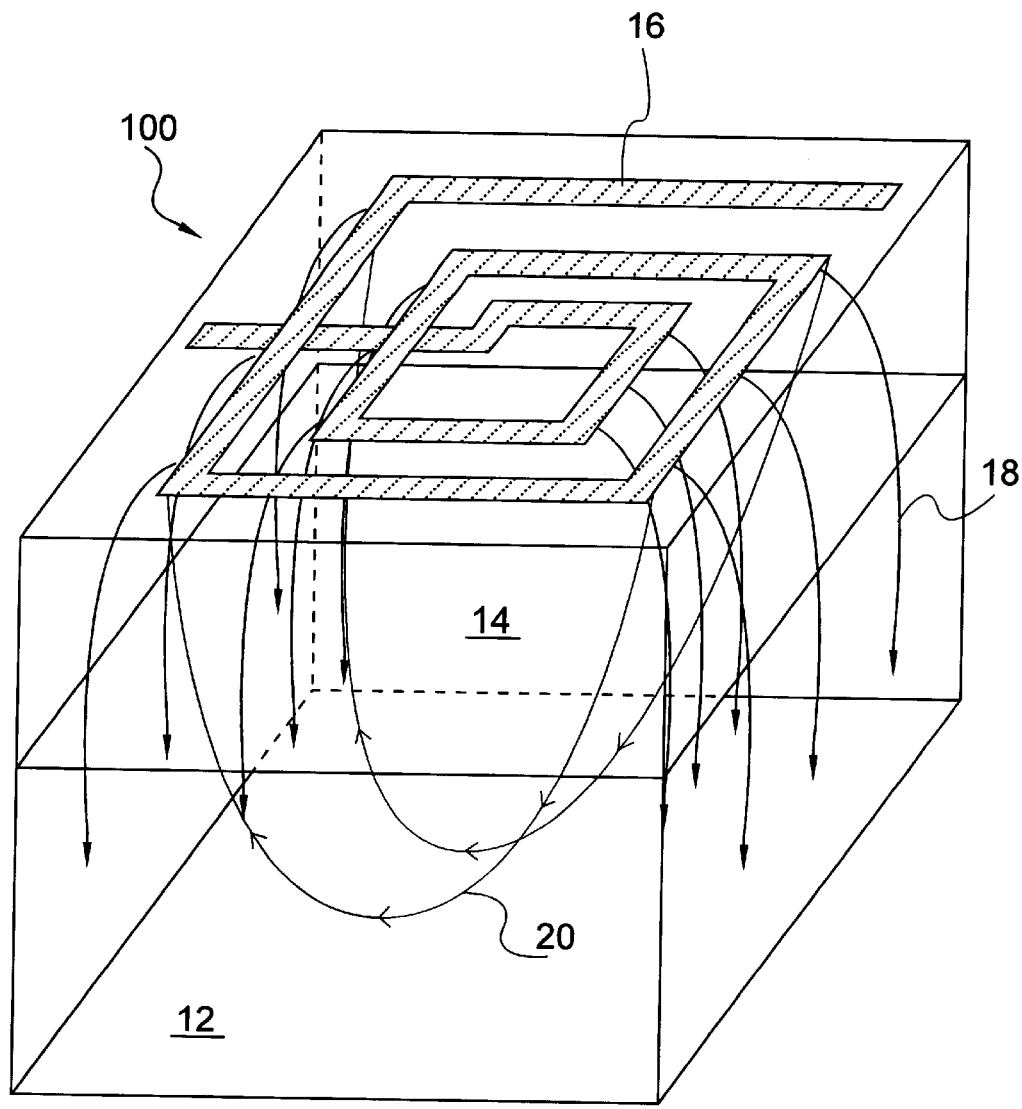
FIG. 3 is a three-dimensional view of a typical prior art spiral inductor/semiconducting substrate IC layout showing the parasitic electric field problem.
Figure 4:
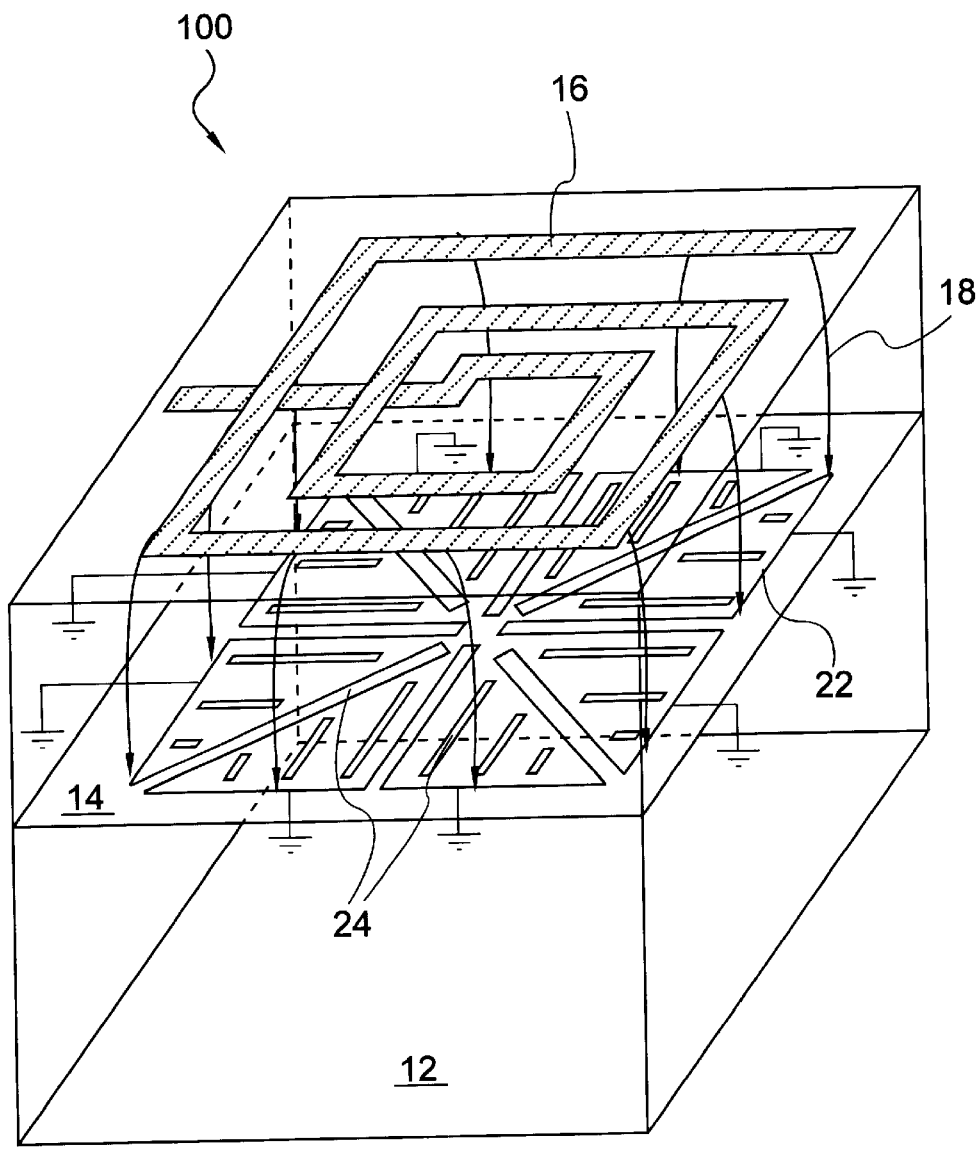
FIG. 4 is another three-dimensional view of a prior art IC that uses the patterned ground plane approach.

Referring now to FIG. 2, conducting via 28 is again shown connected to ground strip 26 and extending substantially perpendicularly away from it in a preferred embodiment of the present invention. Horizontal wiring sections 30 alternate with vertical interconnect sections 32 along the length of conducting via 28. Conducting via 28 is thus composed of alternating layers of horizontal wiring material and vertical interconnect material, deposited layer by layer in the natural course of standard damascene fill process IC fabrication. Horizontal wiring sections 30, shown in this FIG. 2 as small blocks of material, are thus actually part of and continuous with their respective planes composed of the same material, namely metal used for wiring. The portions of these planes that form horizontal wiring sections 30 are set off only by the fact that they are in the column defined by conducting via 28.

Vertical interconnect sections 32 function to link each interconnect section 30 that forms part of conducting via 28. The material that forms vertical interconnect sections 32, along with the wiring material of horizontal wiring sections 30, is conductive. Preferentially this conductive material is low-resistivity metal. In one embodiment of the present invention the low-resistivity metal is copper. In another embodiment it is aluminum. However, the conductive material should not be understood to be confined to those mentioned, but can be any material that is conductive and is appropriate for use in an integrated semiconducting device.

Fabrication of conducting vias 28 is accomplished without any additional steps using the standard damascene fill process manufacturing method common in integrated semiconductor manufacture. Conducting vias 28 are constructed layer by layer simultaneously with the rest of the device. Horizontal wiring sections 30 are put in place at the same time the corresponding metal level is laid down, and vertical interconnect sections 32 are formed together with the layers they form a part of. This ease of manufacture is an important feature of the present invention.

The standard damascene fill process will now be explained in greater detail. In its simplest form, this process starts with an insulating layer which is first formed on a substrate and then smoothed out, or planarized. Horizontal trenches are then etched into the insulating layer corresponding to the required metal line pattern, and vertical holes are etched into the hole locations that will descend down through the insulating layer to the underlying features. Metal is next deposited over the substrate, thereby filling the trenches and the holes, and hence forming metal lines and the interconnect holes simultaneously. As a final step, the resulting surface is planarized using, for example, the well-known chemical-mechanical polish (CMP) procedure, and readied to accept another dual damascene structure-integrally inlaid wiring both in the horizontal trenches and vertical holes. In the present invention, conducting vias 28 comprise alternating layers of the metal lines and filled-in interconnect holes mentioned above. In other words, conducting vias 28 are not separately-manufactured components of the integrated circuit but naturally integrated pieces of the device that are created in the normal flow of the manufacturing process.

Thus, a preferred embodiment of the present invention has been described, wherein a semiconducting device is provided comprising a ground plane disposed between a spiral inductor and a conductive substrate. The ground plane is cut into a plurality of ground strips in order to prevent the flow of image current that would be induced in a solid ground plane by the magnetic field of the inductor. The ground strips are linked to the inductor by multiple connecting posts called conducting vias. These conducting vias, preferably formed from low-resistivity metal like copper or aluminum, act to terminate the parasitic electric field without excessively increasing the capacitance to ground.

In the most preferred embodiment, fabrication of the conducting vias into the back-end-of-line (BEOL) metallurgy is accomplished by simply adding the via patterns to existing mask level designs and performing standard damascene fill processes as is currently practiced to form test via chains. The invention can thus be manufactured relatively inexpensively because no additional steps are necessary in the fabrication process. A further advantage of the invention is that it acts like a Faraday cage to eliminate unwanted electromagnetic radiation in the space inside the box formed by the inductor, the ground strips, and the vertical conducting vias. Because the integrated circuit of this invention is simple to manufacture, it is easy to optimize the number and placement of the conducting vias to serve the integrated circuit's intended purpose.

While the invention has been particularly shown and described with reference to preferred embodiments thereof, it will be understood by those skilled in the art that various changes in form and details, such as those pointed out in various places throughout the foregoing sections, may be made therein without departing from the spirit and scope of the invention.

We claim:

1. An integrated semiconducting device comprising:
   (a) a semiconducting substrate;
   (b) a metal ground plane disposed on said semiconducting substrate, said metal ground plane comprising multiple strips of conducting material;
   (c) an inductor disposed above said ground plane; and
   (d) a plurality of conducting metal vias, each one of said plurality of conducting vias connected to and extending away from said ground plane toward said inductor but electrically isolated from said inductor.

2. The structure of claim 1 where said semiconducting substrate is composed of silicon.

3. The structure of claim 1 where said inductor is a spiral inductor.

4. The structure of claim 1 where said plurality of conducting vias extend substantially perpendicularly away from said ground strips.

5. The structure of claim 1 where said ground plane, said plurality of conducting vias, and said spiral inductor are formed within a dielectric layer.

6. The structure of claim 1 where said ground strips lie in a common plane, said ground strips being parallel to and isolated from each other by a gap interposed between adjacent ground strips.

7. The structure of claim 1 where said conducting vias are composed of alternating layers of horizontal wiring material and vertical interconnect material.

8. The structure of claim 1 where said conducting vias are composed of low resistivity metal.

9. The structure of claim 8 where said low resistivity metal is copper.

10. The structure of claim 8 where said low resistivity metal is aluminum.

11. An integrated semiconducting device comprising:
    (a) a semiconducting substrate;
    (b) a ground plane disposed on said semiconducting substrate, said ground plane comprising multiple strips of conducting material;
    (c) an inductor disposed above said ground plane; and
    (d) a plurality of conducting vias formed underneath and isolated from said inductor and within a dielectric layer, each one of said plurality of conducting vias connected to and extending away from said ground plane toward said inductor.

12. The structure of claim 11 where said semiconducting substrate is composed of silicon.

13. The structure of claim 11 where said inductor is a spiral inductor.

14. The structure of claim 11 where said plurality of conducting vias extend substantially perpendicularly away from said ground strips.

15. The structure of claim 11 where said ground strips lie in a common plane, said ground strips being parallel to and isolated from each other by a gap interposed between adjacent ground strips.

16. The structure of claim 11 where said conducting vias are composed of alternating layers of horizontal wiring material and vertical interconnect material.

17. The structure of claim 11 where said conducting vias are composed of low resistivity metal.

18. The structure of claim 17 where said low resistivity metal is copper.

19. The structure of claim 17 where said low resistivity metal is aluminum.

20. An integrated semiconducting device comprising:
    (a) a semiconducting substrate;
    (b) a ground plane disposed on said semiconducting substrate, said ground plane comprising multiple strips of conducting material isolated from each other by a gap interposed between adjacent strips;
    (c) an inductor disposed above said ground plane; and
    (d) a plurality of conducting vias, each one of said plurality of conducting vias connected to and extending away from said ground plane toward said inductor but electrically isolated from said inductor.

21. The structure of claim 20 where said semiconducting substrate is composed of silicon.

22. The structure of claim 20 where said inductor is a spiral inductor.

23. The structure of claim 20 where said plurality of conducting vias extend substantially perpendicularly away from said ground strips.

24. The structure of claim 20 where said ground plane, said plurality of conducting vias, and said spiral inductor are formed within a dielectric layer.

25. The structure of claim 20 where said conducting vias are composed of alternating layers of horizontal wiring material and vertical interconnect material.

26. The structure of claim 20 where said conducting vias are composed of low resistivity metal.

27. The structure of claim 26 where said low resistivity metal is copper.

28. The structure of claim 26 where said low resistivity metal is aluminum.

* * * * *